United States Patent
Das et al.

(10) Patent No.: US 7,449,381 B2
(45) Date of Patent: Nov. 11, 2008

(54) METHOD OF MAKING A CAPACITIVE SUBSTRATE FOR USE AS PART OF A LARGER CIRCUITIZED SUBSTRATE, METHOD OF MAKING SAID CIRCUITIZED SUBSTRATE AND METHOD OF MAKING AN INFORMATION HANDLING SYSTEM INCLUDING SAID CIRCUITIZED SUBSTRATE

(75) Inventors: Rabindra N. Das, Ithaca, NY (US);
John M. Lauffer, Waverly, NY (US);
How T. Lin, Vestal, NY (US); Voya R. Markovich, Endwell, NY (US)

(73) Assignee: Endicott Interconect Technologies, Inc., Endicott, NY (US)

( * ) Notice: Subject to any disclaimer, the term of this patent is extended or adjusted under 35 U.S.C. 154(b) by 406 days.

(21) Appl. No.: 11/352,279

(22) Filed: Feb. 13, 2006

(65) Prior Publication Data
US 2007/0010065 A1    Jan. 11, 2007

Related U.S. Application Data

(63) Continuation-in-part of application No. 11/172,794, filed on Jul. 5, 2005, now Pat. No. 7,384,856.

(51) Int. Cl.
*H01L 21/8234* (2006.01)
*H01L 21/00* (2006.01)

(52) U.S. Cl. ................ 438/238; 438/253; 438/381; 438/393; 257/E21.008

(58) Field of Classification Search ................ 438/238, 438/250, 253, 381, 393; 257/E21.008
See application file for complete search history.

(56) References Cited

U.S. PATENT DOCUMENTS

| | | | |
|---|---|---|---|
| 5,016,085 | A | 5/1991 | Hubbard et al. |
| 5,079,069 | A | 1/1992 | Howard et al. |
| 5,099,309 | A | 3/1992 | Kryzaniwsky |
| 5,162,977 | A | 11/1992 | Paurus et al. |
| 5,280,192 | A | 1/1994 | Kryzaniwsky |
| 5,426,263 | A | 6/1995 | Potter et al. |
| 5,831,833 | A | 11/1998 | Shirakawa et al. |
| 6,068,782 | A | 5/2000 | Brandt et al. |
| 6,084,306 | A | 7/2000 | Yew et al. |
| 6,150,456 | A | 11/2000 | Lee et al. |
| 6,207,595 | B1 | 3/2001 | Appelt et al. |
| 6,242,282 | B1 | 6/2001 | Fillion et al. |
| 6,370,012 | B1 | 4/2002 | Adae-Amoakoh et al. |
| 6,395,996 | B1 | 5/2002 | Tsai et al. |
| 6,446,317 | B1 | 9/2002 | Figueroa et al. |
| 6,524,352 | B2 | 2/2003 | Adae-Amoakoh et al. |
| 6,544,651 | B2 | 4/2003 | Wong et al. |

(Continued)

*Primary Examiner*—Hsien-ming Lee
(74) *Attorney, Agent, or Firm*—Hinman, Howard & Kattell; Mark Levy; Lawrence R. Fraley

(57) ABSTRACT

A method of forming a capacitive substrate in which at least one capacitive dielectric layer of material is screen or ink jet printed onto a conductor and the substrate is thereafter processed further, including the addition of thru-holes to couple selected elements within the substrate to form at least two capacitors as internal elements of the substrate. The capacitive substrate may be incorporated within a larger circuitized substrate, e.g., to form an electrical assembly. A method of making an information handling system including such substrates is also provided.

19 Claims, 3 Drawing Sheets

U.S. PATENT DOCUMENTS

| | | |
|---|---|---|
| 6,616,794 B2 | 9/2003 | Hartman et al. |
| 6,704,207 B2 | 3/2004 | Kopf |
| 7,235,745 B2 * | 6/2007 | Das et al. .................... 174/260 |
| 2006/0151863 A1 * | 7/2006 | Das et al. .................... 257/678 |

* cited by examiner

METHOD OF MAKING A CAPACITIVE SUBSTRATE FOR USE AS PART OF A LARGER CIRCUITIZED SUBSTRATE, METHOD OF MAKING SAID CIRCUITIZED SUBSTRATE AND METHOD OF MAKING AN INFORMATION HANDLING SYSTEM INCLUDING SAID CIRCUITIZED SUBSTRATE

The present application is a continuation-in-part application of Ser. No. 11/172,794, filed Jul. 5, 2005 now U.S. Pat. No. 7,384,856.

TECHNICAL FIELD

The present invention relates to methods of forming capacitors within circuitized substrates such as printed circuit boards, chip carriers and the like, and to products including such internal capacitors as part thereof.

CROSS REFERENCE TO CO-PENDING APPLICATIONS

In Ser. No. 10/900,385, entitled "Circuitized Substrate With Internal Organic Memory Device, Method Of Making Same, Electrical Assembly Utilizing Same, and Information Handling System Utilizing Same" and filed Jul. 28, 2004 (inventors: S. Desai et al), there is defined a circuitized substrate comprised of at least one layer of dielectric material having an electrically conductive pattern thereon. At least part of the pattern is used as the first layer of an organic memory device which further includes at least a second dielectric layer over the pattern and a second pattern aligned with respect to the lower part for achieving several points of contact to thus form the device. The substrate is preferably combined with other dielectric-circuit layered assemblies to form a multilayered substrate on which can be positioned discrete electronic components (e.g., a logic chip) coupled to the internal memory device to work in combination therewith. An electrical assembly capable of using the substrate is also provided, as is an information handling system adapted for using one or more such electrical assemblies as part thereof. This application is assigned to the same assignee of the present invention.

In Ser. No. 10/900,386, entitled "Electrical Assembly With Internal Memory, Circuitized Substrate Having Electrical Components Positioned Thereon, Method Of Making Same, And Information Handling System Utilizing Same" and filed Jul. 28, 2004 (inventors: F. Egitto et al), there is defined an electrical assembly which includes a circuitized substrate comprised of an organic dielectric material having a first electrically conductive pattern thereon. At least part of the dielectric layer and pattern form the first, base portion of an organic memory device, the remaining portion being a second, polymer layer formed over the part of the pattern and a second conductive circuit formed on the polymer layer. A second dielectric layer if formed over the second conductive circuit and first circuit pattern to enclose the organic memory device. The device is electrically coupled to a first electrical component through the second dielectric layer and this first electrical component is electrically coupled to a second electrical component. A method of making the electrical assembly is also provided, as is an information handling system adapted for using one or more such electrical assemblies as part thereof. This application is also assigned to the same assignee as the present invention.

In Ser. No. 11/031,085, entitled "Capacitor Material For Use In Circuitized Substrates, Circuitized Substrate Utilizing Same, Method of Making Said Circuitized Substrate, and Information Handling System Utilizing Said Circuitized Substrate" and filed Jan. 10, 2005, there is defined a material for use as part of an internal capacitor within a circuitized substrate wherein the material includes a polymer (e.g., a cycloaliphatic epoxy or phenoxy based) resin and a quantity of nano-powders of ferroelectric ceramic material (e.g., barium titanate) having a particle size substantially in the range of from about 0.01 microns to about 0.90 microns and a surface area for selected ones of these particles within the range of from about 2.0 to about 20 square meters per gram. A circuitized substrate adapted for using such a material and capacitor therein and a method of making such a substrate are also defined. An electrical assembly (substrate and at least one electrical component) and an information handling system (e.g., personal computer) are also defined.

In Ser. No. 11/031,074, entitled "Capacitor Material With Metal Component For Use In Circuitized Substrates, Circuitized Substrate Utilizing Same, Method of Making Said Circuitized Substrate, and Information Handling System Utilizing Said Circuitized Substrate" and filed Jan. 10, 2005, there is defined a material for use as part of an internal capacitor within a circuitized substrate in which the material includes a polymer resin and a quantity of nano-powders including a mixture of at least one metal component and at least one ferroelectric ceramic component, the ferroelectric ceramic component nano-particles having a particle size substantially in the range of between about 0.01 microns and about 0.9 microns and a surface within the range of from about 2.0 to about 20 square meters per gram. A circuitized substrate adapted for using such a material and capacitor therein and a method of making such a substrate are also defined. An electrical assembly (substrate and at least one electrical component) and an information handling system (e.g., personal computer) are also defined.

In Ser. No. 11/172,794, entitled "Method Of Making An Internal Capacitive Substrate For Use In a Circuitized Substrate And Method Of Making Said Circuitized Substrate" and filed Jul. 5, 2005, there is defined a method of forming a capacitive substrate in which first and second conductors are formed opposite a dielectric, with one of these electrically coupled to a thru-hole connection. Each functions as an electrode for the resulting capacitor. The substrate is then adapted for being incorporated within a larger structure to form a circuitized substrate such as a printed circuit board or a chip carrier. Additional capacitors are also possible.

All of the above pending applications are assigned to the same Assignee as the present invention.

BACKGROUND OF THE INVENTION

Typically, circuitized substrates such as printed circuit boards (hereinafter also referred to as PCBs), chip carriers, and the like are constructed in laminate form in which several layers of dielectric material and conductive material (laminates) are bonded together using relatively high temperature and pressure lamination processes. The conductive layers, typically of thin copper, are usually used in the formed substrate for providing electrical connections to and among various devices located on the surface of the substrate, examples of such devices being integrated circuits (semiconductor chips) and discrete passive devices, such as capacitors, resistors, inductors, and the like. The discrete passive devices occupy a high percentage of the surface area of the completed substrate, which is undesirable from a future design aspect because of the increased need and demand for miniaturization in today's substrates and products containing same art.

In order to increase the available substrate surface area (also often referred to as "real estate") of such substrates, there have been a variety of efforts to include multiple functions (e.g. resistors, capacitors and the like) on a single component for mounting on a board. When passive devices are in such a configuration, these are often referred to collectively and individually as integral passive devices or the like, meaning that the functions are integrated into the singular component. Because of such external positioning, these components still utilize, albeit less than if in singular form, valuable board real estate. In response, there have also been efforts to embed discrete passive components within the board, such components often also referred to as embedded passive components. A capacitor designed for disposition within (between selected layers of) a PCB (board) substrate may thus be referred to as an embedded integral passive component, or, more simply, an embedded capacitor. Such a capacitor thus provides internal capacitance. The result of this internal positioning is that it is unnecessary to also position such devices externally on the PCB's outer surface(s), thus saving valuable PCB real estate.

For a fixed capacitor area, two known approaches are available for increasing the planar capacitance (capacitance/area) of an internal capacitor. In one such approach, higher dielectric constant materials can be used, while in a second, the thickness of the dielectric can be reduced. These constraints are reflected in the following formula, known in the art, for capacitance per area:

$$C/A = (Dielectric\ Constant\ of\ Laminate \times Dielectric\ Constant\ in\ Vacuum/Dielectric\ Thickness)$$

where: C is the capacitance and A is the capacitor's area. Some of the patents listed below, particularly U.S. Pat. No. 5,162,977, mention use of various materials for providing desired capacitance levels under this formula, and many mention or suggest problems associated with the methods and resulting materials used to do so.

As stated, there have been past attempts to provide internal capacitance and other internal conductive structures, components or devices (one good example being internal semiconductor chips) within circuitized substrates such as PCBs, some of these including the use of nano-powders (as also defined in Ser. No. 11/031,085 and Ser. No. 11/172,794 cited above). The following are some examples of such attempts, including those using nano-powders and those using alternative measures.

In U.S. Pat. No. 6,704,207, entitled "Device and Method for Interstitial Components in a Printed Circuit Board", issued Mar. 9, 2004, there is described a printed circuit board (PCB) which includes a first layer having first and second surfaces, with an above-board device (e.g., an ASIC chip) mounted thereon. The PCB includes a second layer having third and fourth surfaces. One of the surfaces can include a recessed portion for securely holding an interstitial component. A "via", electrically connecting the PCB layers, is also coupled to a lead of the interstitial component. The described interstitial components include components such as diodes, transistors, resistors, capacitors, thermocouples, and the like. In what appears to be the preferred embodiment, the interstitial component is a resistor having a similar size to a "0402" resistor (manufactured by Rohm Co.), which has a thickness of about 0.014 inches.

In U.S. Pat. No. 6,616,794, entitled "Integral Capacitance For Printed Circuit Board Using Dielectric Nanopowders" and issued Sep. 9, 2003, there is described a method for producing integral capacitance components for inclusion within printed circuit boards in which hydro-thermally prepared nano-powders permit the fabrication of dielectric layers that offer increased dielectric constants and are readily penetrated by micro-vias. In the method described in this patent, a slurry or suspension of a hydro-thermally prepared nano-powder and solvent is prepared. A suitable bonding material, such as a polymer, is mixed with the nano-powder slurry, to generate a composite mixture which is formed into a dielectric layer. The dielectric layer may be placed upon a conductive layer prior to curing, or conductive layers may be applied upon a cured dielectric layer, either by lamination or metallization processes, such as vapor deposition or sputtering.

In U.S. Pat. No. 6,544,651, entitled "High Dielectric Constant Nano-Structure Polymer-Ceramic Composite" and issued Apr. 3, 2003, there is described a polymer-ceramic composite having high dielectric constants formed using polymers containing a metal acetylacetonate (acacs) curing catalyst. In particular, a certain percentage of Co (III) may increase the dielectric constant of a certain epoxy. The high dielectric polymers are combined with fillers, preferably ceramic fillers, to form two phase composites having high dielectric constants. Composites having about 30 to about 90% volume ceramic loading and a high dielectric base polymer, preferably epoxy, were apparently found to have dielectric constants greater than about 60. Composites having dielectric constants greater than about 74 to about 150 are also mentioned in this patent. Also mentioned are embedded capacitors with capacitance densities of at least 25 nF/cm.sup.2, preferably at least 35 nF/cm.sup.2, most preferably 50 nF/cm.sup.2.

In U.S. Pat. No. 6,524,352, entitled "Method Of Making A Parallel Capacitor Laminate" and issued Feb. 25, 2003, there is defined a parallel capacitor structure capable of forming an internal part of a larger circuit board or the like structure to provide capacitance therefore. Alternatively, the capacitor may be used as an inter-connector to interconnect two different electronic components (e.g., chip carriers, circuit boards, and semiconductor chips) while still providing desired levels of capacitance for one or more of said components. The capacitor includes at least one internal conductive layer, two additional conductor layers added on opposite sides of the internal conductor, and inorganic dielectric material (preferably an oxide layer on the second conductor layer's outer surfaces or a suitable dielectric material such as barium titanate applied to the second conductor layers). Further, the capacitor includes outer conductor layers atop the inorganic dielectric material, thus forming a parallel capacitor between the internal and added conductive layers and the outer conductors.

In U.S. Pat. No. 6,446,317, entitled "Hybrid Capacitor And Method Of Fabrication Therefor", and issued Sep. 10, 2002, there is described a hybrid capacitor associated with an integrated circuit package that provides multiple levels of excess, off-chip capacitance to die loads. The hybrid capacitor includes a low inductance, parallel plate capacitor which is embedded within the package and electrically connected to a second source of off-chip capacitance. The parallel plate capacitor is disposed underneath a die, and includes a top conductive layer, a bottom conductive layer, and a thin dielectric layer that electrically isolates the top and bottom layers. The second source of off-chip capacitance is a set of self-aligned via capacitors, and/or one or more discrete capacitors, and/or an additional parallel plate capacitor. Each of the self-aligned via capacitors is embedded within the package, and has an inner conductor and an outer conductor. The inner conductor is electrically connected to either the top or bottom conductive layer, and the outer conductor is electrically connected to the other conductive layer. The discrete capacitors are electrically connected to contacts from the conductive layers to the surface of the package. During operation, one of the conductive layers of the low inductance parallel plate capacitor provides a ground plane, while the other conductive layer provides a power plane.

In U.S. Pat. No. 6,395,996, entitled "Multi-layered Substrate With Built-In Capacitor Design" and issued May 28, 2002, there is described a multi-layered substrate having built-in capacitors which are used to decouple high frequency noise generated by voltage fluctuations between a power plane and a ground plane of a multi-layered substrate. At least one kind of dielectric material, which has filled-in through holes between the power plane and the ground plane and includes a high dielectric constant, is used to form the built-in capacitors.

In U.S. Pat. No. 6,370,012, entitled "Capacitor Laminate For Use In A Printed Circuit Board And As An Inter-connector" and issued Apr. 9, 2002, there is described a parallel capacitor structure capable of forming an internal part of a larger circuit board or the like structure to provide capacitance there-for. Alternatively, the capacitor may be used as an inter-connector to interconnect two different electronic components (e.g., chip carriers, circuit boards, and even semiconductor chips) while still providing desired levels of capacitance for one or more of said components. The capacitor includes at least one internal conductive layer, two additional conductor layers added on opposite sides of the internal conductor, and inorganic dielectric material (preferably an oxide layer on the second conductor layer's outer surfaces or a suitable dielectric material such as barium titanate applied to the second conductor layers). Further, the capacitor includes outer conductor layers atop the inorganic dielectric material, thus forming a parallel capacitor between the internal and added conductive layers and the outer conductors.

In U.S. Pat. No. 6,242,282, entitled "Circuit Chip Package and Fabrication Method", issued Jun. 5, 2001, there is described a method for packaging a chip which includes the steps of providing an interconnect layer including insulative material having a first side and a second side, initial metallization patterned on second side metallized portions of the second side and not on second side non-metallized portions of the second side, a substrate via extending from the first side to one of the second side metallized portions, and a chip via extending from the first side to the second side non-metallized portion. The method also includes positioning a chip on the second side with a chip pad of the chip being aligned with the chip via, and patterning connection metallization on selected portions of the first side of the interconnect layer and in the via so as to extend to the second side metallized portion and to the chip pad. About the chip is molded a "substrate" or other dielectric material.

In U.S. Pat. No. 6,207,595, entitled "Laminate and Method of Manufacture Thereof", issued Mar. 27, 2001, there is described a fabric-resin dielectric material for use in a laminate structure and method of its manufacture. The resulting structure is adaptable for use in a printed circuit board or chip carrier substrate. The resin may be an epoxy resin such as is currently used on a large scale worldwide for "FR-4" composites. A resin material based on bismaleimide-triazine (BT) is also acceptable, this patent further adding that, more preferably, the resin is a phenolically hardenable resin material as is known in the art, with a glass transition temperature of about 145 degrees Celsius (C.).

In U.S. Pat. No. 6,150,456, entitled "High Dielectric Constant Flexible Polyimide Film And Process Of Preparations, issued Nov. 21, 2000, there is described a flexible, high dielectric constant polyimide film composed of either a single layer of an adhesive thermoplastic polyimide film or a multilayer polyimide film having adhesive thermoplastic polyimide film layers bonded to one or both sides of the film and having dispersed in at least one of the polyimide layers from 4 to 85 weight % of a ferroelectric ceramic filler, such as barium titanate or polyimide-coated barium titanate, and having a dielectric constant of from 4 to 60. The high dielectric constant polyimide film can be used in electronic circuitry and electronic components such as multilayer printed circuits, flexible circuits, semiconductor packaging and buried (internal) film capacitors.

In U.S. Pat. No. 6,084,306, entitled "Bridging Method of Interconnects for Integrated Circuit Packages", issued Jul. 4, 2000, there is described an integrated circuit package having first and second layers, a plurality of routing pads being integral with the first layer, a plurality of upper and lower conduits, respectively, disposed on the upper and lower surfaces of the first layer, one of the upper conduits electrically connected to one of the lower conduits, a plurality of pads disposed on the second layer, vias that electrically connect the pads to the lower conduits and a chip adhered to the second layer having bonding pads, at least one of which is electrically connected to one of the routing pads.

In U.S. Pat. No. 6,068,782, entitled "Individual Embedded Capacitors For Laminated Printed Circuit Boards" and issued May 30, 2000, there is described a method of fabricating individual, embedded capacitors in multilayer printed circuit boards. The method is allegedly compatible of being performed using standard printed circuit board fabrication techniques. The capacitor fabrication is based on a sequential build-up technology employing a first pattern-able insulator. After patterning of the insulator, pattern grooves are filled with a high dielectric constant material, typically a polymer/ceramic composite. Capacitance values are defined by the pattern size, thickness and dielectric constant of the composite. Capacitor electrodes and other electrical circuitry can be created either by etching laminated copper, by metal evaporation or by depositing conductive ink.

In U.S. Pat. No. 5,831,833, entitled "Bare Chip Mounting Printed Circuit Board and a Method of Manufacturing Thereof by Photo-etching", issued Nov. 3, 1998, there is described a method of manufacturing a "bare chip" multilayer printed circuit board in which arbitrary numbers of wiring circuit conductor layers and insulating layers are alternately stacked on one or both surfaces of a printed circuit board as a substrate, and a recessed portion with an upper opening capable of mounting and resin-encapsulating a bare chip part is formed on the surface of the printed circuit board. In what appears to be the preferred embodiment, one of the insulating layers is made from a photosensitive resin, and the bare chip part mounting recessed portion is formed by photo-etching the insulating layer made from the photosensitive resin.

In U.S. Pat. No. 5,426,263, entitled "Electronic Assembly Having a Double-sided Leadless Component", issued Jun. 20, 1995, there is described an electronic assembly which has a double-sided leadless component and two printed circuit boards. The component has a plurality of electrical terminations or pads on both opposing major surfaces. Each of the printed circuit boards has a printed circuit pattern that has a plurality of pads that correspond to the electrical terminations on both sides of the double-sided leadless component. The electrical terminals on one side of the component are attached to the pads on the first board and the electrical terminals on the other side of the leadless component are attached to the pads on the second board. The printed circuit boards are joined together to form a multilayered circuit board so that the double-sided leadless component is buried or recessed inside. The component is attached to the pads of the printed circuit board using solder.

In U.S. Pat. No. 5,280,192, entitled "Three-dimensional Memory Card Structure With Internal Direct Chip Attachment", issued Jan. 18, 1994, there is described a card structure which includes an internal three dimensional array of implanted semiconductor chips. The card structure includes a power core and a plurality of chip cores. Each chip core is joined to the power core on opposite surfaces of the power core, and each chip core includes a compensator core having a two dimensional array of chip wells. Each chip well allows for a respective one of the semiconductor chips to be implanted therein. Further, a compliant dielectric material is disposed on the major surfaces of the compensator core except at the bottoms of the chip wells. The compliant dielectric material has a low dielectric constant and has a thermal coefficient of expansion compatible with those of the semiconductor chips and the compensator core, so that thermal expansion stability with the chips and the compensator core is maintained.

In U.S. Pat. No. 5,162,977, entitled "Printed Circuit Board Having An Integrated Decoupling Capacitive Element" and issued Nov. 10, 1992, there is described a PCB which includes a high capacitance power distribution core, the manufacture of which is compatible with standard printed circuit board assembly technology. The high capacitance core consists of a ground plane and a power plane separated by a planar element having a high dielectric constant. The high dielectric constant material is typically glass fiber impregnated with a bonding material, such as epoxy resin loaded with a ferro-electric ceramic substance having a high dielectric constant. The ferro-electric ceramic substance is typically a nano-powder combined with an epoxy bonding material. According to this patent, the resulting capacitance of the power distribution core is sufficient to totally eliminate the need for decoupling capacitors on a PCB.

Use of pre-fired and ground ceramic nano-powders in the dielectric layer generally poses obstacles for the formation of thru-holes (conductive holes permitting electronic communication between conductive layers of a PCB), however. Pre-fired and ground ceramic nano-powder particles have a typical dimension in the range of 500-20,000 nanometers (nm). Furthermore, the particle distribution in this range is generally rather broad, meaning that there could be a 10,000 nm particle alongside a 500 nm particle. The distribution within the dielectric layer of particles of different size often presents major obstacles to thru-hole formation where the thru-holes are of extremely small diameter, also referred to in the industry as micro-vias due to the presence of the larger particles. Another problem associated with pre-fired ceramic nano-powders is the ability for the dielectric layer to withstand substantial voltage without breakdown occurring across the layer. Typically, capacitance layers within a PCB are expected to withstand at least 300 volts (V) in order to qualify as a reliable component for PCB construction. The presence of the comparatively larger ceramic particles in pre-fired ceramic nano-powders within a capacitance layer prevents extremely thin layers from being used because the boundaries of contiguous large particles provide a path for voltage breakdown. This is even further undesirable because, as indicated by the equation cited above, greater planar capacitance may also be achieved by reducing the thickness of the dielectric layer. The thickness is thus limited by the size of the particles therein.

In U.S. Pat. No. 5,099,309, entitled "Three-dimensional Memory Card Structure With Internal Direct Chip Attachment", issued Mar. 24, 1992, there is described a memory card structure containing an embedded three dimensional array of semiconductor memory chips. The card structure includes at least one memory core and at least one power core which are joined together in an overlapping relationship. Each memory core comprises a copper-invar-copper (CIC) thermal conductor plane having a two dimensional array of chip well locations on each side of the plane.

Polytetrafluoroethylene (PTFE) covers the major surfaces of the thermal conductor plane except at the bottoms of the chip wells. Memory chips are placed in the chip wells and are covered by insulating and wiring levels. Each power core comprises at least one CIC electrical conductor plane and PTFE covering the major surfaces of the electrical conductor plane. Provision is made for providing electrical connection pathways and cooling pathways along vertical as well as horizontal planes internal to the card structure.

In U.S. Pat. No. 5,079,069, entitled "Capacitor Laminate For Use In Capacitive Printed Circuit Boards And Methods Of Manufacture" and issued Jan. 7, 1992, there is described a capacitor laminate which allegedly serves to provide a bypass capacitive function for devices mounted on the PCB, the capacitor laminate being formed of conventional conductive and dielectric layers whereby each individual external device is allegedly provided with capacitance by a proportional portion of the capacitor laminate and by borrowed capacitance from other portions of the capacitor laminate, the capacitive function of the capacitor laminate being dependent upon random firing or operation of the devices. That is, the resulting PCB still requires the utilization of external devices thereon, and thus does not afford the PCB external surface area real estate savings mentioned above which are desired and demanded in today's technology.

In U.S. Pat. No. 5,016,085, entitled "Hermetic package for integrated circuit chips, issued May 14, 1991, there is described a hermetic package which has an interior recess for holding a semiconductor chip. The recess is square and set at 45 degrees with respect to the rectangular exterior of the package. The package uses ceramic layers which make up the package's conductive planes with the interior opening stepped to provide connection points. The lowest layer having a chip opening therein may be left out of the assembly to provide a shallower chip opening recess. This of course is not the same as an internally formed capacitance or semiconductor component of the nature described above, but it does mention internal ceramic layers for a specified purpose as part of an internal structure.

The teachings of the above patents and five co-pending applications are incorporated herein by reference. As stated, this application is a continuation-in-part of Ser. No. 11/172,794, the last of the five pending patent applications listed above.

Generally speaking, with respect to commercially available dielectric powders which have been used in internal conductive structures such as mentioned in some of the above patents, among these being metal titanate-based powders (see, e.g., U.S. Pat. No. 6,150,456), such powders are known to be produced by a high-temperature, solid-state reaction of a mixture of the appropriate stoichiometric amounts of oxides or oxide precursors (e.g., carbonates, hydroxides or nitrates) of barium, calcium, titanium, and the like. In such calcination processes, the reactants are wet-milled to accomplish a desired final mixture. The resulting slurry is dried and fired at elevated temperatures, sometimes as high as 1,300 degrees Celsius (C), to attain the desired solid state reactions. Thereafter, the fired product is milled to produce a powder. Although the pre-fired and ground dielectric formulations produced by solid phase reactions are acceptable for many electrical applications, these suffer from several disadvantages. First, the milling step serves as a source of contaminants, which can adversely affect electrical properties. Second, the milled product consists of irregularly shaped fractured aggregates which are often too large in size and possess a wide particle size distribution, 500-20,000 nm. Consequently, films produced using these powders are limited to thicknesses greater than the size of the largest particle. Thirdly, powder suspensions or composites produced using pre-fired ground ceramic powders typically must be used immediately after dispersion, due to the high sedimentation rates associated with large particles. The stable crystalline phase of barium titanate for particles greater than 200 nm is tetragonal and, at elevated temperatures, a large increase in dielectric constant occurs due to a phase transition. It is thus clear that methods of making PCBs which rely on the advantageous features of using nano-powders as part of the PCB's internal components or the like, such as those described in selected ones of the above patents, possess various undesirable aspects which are detrimental to providing a PCB with optimal functioning capabilities when it comes to internal capacitance or other electrical operation. This is particularly true when the desired final product attempts to meet today's miniaturization demands, including the utilization of high density patterns of thru-holes therein.

Ser. No. 11/172,794, mentioned above, defines a new and unique method of making a capacitive substrate in which the method can be performed in a facile manner using, for the most part, conventional substrate processes. As shown in FIG. 2 of this pending application's drawings, a multiple (two or more) capacitor structure is formed using two similarly formed "sandwiches" each of an interim dielectric layer having opposed conductive layers thereon. At least one conductive layer of each "sandwich" is circuitized and includes individual conductors as part thereof. The two structures are bonded together, e.g., using conventional lamination processing, with an interim dielectric layer, to form a multi-layered substrate in which at least two capacitors are internally located and adapted for being coupled to other parts of the substrate's circuitry. Thru-holes are formed within the substrate to also provide connections to respective parts of the capacitor conductive members. One example of the completed substrate is shown in FIG. 7 of Ser. No. 11/172,794, and another shown in FIG. 9.

As defined herein, the present invention represents another approach to forming internal capacitors in a substrate, compared particularly to the method taught in Ser. No. 11/172,794. In the present invention, at least two capacitors may be formed by initially forming a first capacitive substrate and then forming (e.g., screening) a quantity of capacitive material on one of the conductive members on at least one side of the initial substrate. This process eliminates the need for providing an interim dielectric layer and is also capable of being performed using known technologies. Significantly, the capacitors formed using the teachings herein are capable of having nano and/or micro particles as part thereof. It is believed that such a method, as well as a method of forming a larger circuitized substrate including the capacitive substrate will represent significant advancements in the art.

OBJECTS AND SUMMARY OF THE INVENTION

It is, therefore, a primary object of the present invention to enhance the circuitized substrate art by providing a method of making a circuitized substrate having the advantageous features taught herein, including a capacitive substrate as part thereof.

It is another object of the invention to provide a method of making such a circuitized substrate which can be accomplished in a relatively facile manner and at relatively low costs.

It is still another object of the invention to provide a method of making a capacitive substrate for use in said circuitized substrates.

According to one aspect of the invention, there is provided a method of making a capacitive substrate, said method comprising: providing a first capacitive dielectric layer having first and second opposing sides; providing first and second conductors on said first and second opposing sides of said first capacitive dielectric layer, respectively; screen printing a second capacitive dielectric layer onto said first conductor on said first opposing side of said first capacitive dielectric layer; providing a third conductor on said second capacitive dielectric layer on said first conductor; forming a first thru-hole electrical connection between said second and third conductors; and forming a second thru-hole electrical connection between said first conductor and a fourth conductor, the first and second conductors and the first capacitive dielectric layer forming a first capacitor and the first and third conductors and second capacitive dielectric layer forming a second capacitor when said capacitive substrate is operational.

According to another aspect of the invention, there is provided a method of making a circuitized substrate having a capacitive substrate therein, said method comprising: forming a capacitive substrate including providing a first capacitive dielectric layer having first and second opposing sides, providing first and second conductors on said first and second opposing sides of said first capacitive dielectric layer, respectively, screen printing a second capacitive dielectric layer onto said first conductor on said first opposing side of said first capacitive dielectric layer, providing a third conductor on said second capacitive dielectric layer on said first conductor, forming a first thru-hole electrical connection between said second and third conductors, and forming a second thru-hole electrical connection between said first conductor and a fourth conductor, the first and second conductors and first capacitive dielectric layer forming a first capacitor and the first and third conductors and second capacitive dielectric layer forming a second capacitor when the capacitive substrate is operational; and forming at least one dielectric layer and at least one conductive layer on opposite sides of said capacitive substrate to form a circuitized substrate having said capacitive substrate as an internal portion thereof.

According to yet another aspect of the invention, there is provided a method of method of making an information handling system including a circuitized substrate having a capacitive substrate therein as part thereof, said method comprising: forming a capacitive substrate including providing a first capacitive dielectric layer having first and second opposing sides, providing first and second conductors on said first and second opposing sides of said first capacitive dielectric layer, respectively, screen printing a second capacitive dielectric layer onto said first conductor on said first opposing side of said first capacitive dielectric layer, providing a third conductor on said second capacitive dielectric layer on said first conductor, forming a first thru-hole electrical connection between said second and third conductors, and forming a second thru-hole electrical connection between said first conductor and a fourth conductor, the first and second conductors and first capacitive dielectric layer forming a first capacitor and the first and third conductors and second capacitive dielectric layer forming a second capacitor when the capacitive substrate is operational; forming at least one dielectric layer and at least one conductive layer on opposite sides of said capacitive substrate to form a circuitized substrate having said capacitive substrate as an internal portion thereof; providing a housing having electrical circuitry therein and positioning said circuitized substrate within said housing and electrically coupling said circuitized substrate to said electrical circuitry, said housing, electrical circuitry and circuitized substrate forming an information handling system.

According to still another aspect of the invention, there is provided a method of making a capacitive substrate, said method comprising: providing a first capacitive dielectric layer having first and second opposing sides; providing first and second conductors on said first and second opposing sides of said first capacitive dielectric layer, respectively; ink jet printing a second capacitive dielectric layer onto said first conductor on said first opposing side of said first capacitive dielectric layer; providing a third conductor on said second capacitive dielectric layer on said first conductor; forming a first thru-hole electrical connection between said second and third conductors; and forming a second thru-hole electrical connection between said first conductor and a fourth conductor, the first and second conductors and first capacitive dielectric layer forming a first capacitor and the first and third conductors and second capacitive dielectric layer forming a second capacitor when the capacitive substrate is operational.

According to a further aspect of the invention, there is provided a method of making a circuitized substrate including a capacitive substrate as part thereof, said method comprising: forming a capacitive substrate including providing a first capacitive dielectric layer having first and second opposing sides, providing first and second conductors on said first and second opposing sides of said first capacitive dielectric layer, respectively, ink jet printing a second capacitive dielectric layer onto said first conductor on said first opposing side of said first capacitive dielectric layer, providing a third conductor on said second capacitive dielectric layer on said first conductor, forming a first thru-hole electrical connection between said second and third conductors, and forming a second thru-hole electrical connection between said first conductor and a fourth conductor, said first and second conductors and said first capacitive dielectric layer forming a first capacitor and said first and third conductors and said second capacitive dielectric layer forming a second capacitor when said capacitive substrate is operational; and forming at least one dielectric layer and at least one conductive layer on opposite sides of said capacitive substrate to form a circuitized substrate having said capacitive substrate as an internal portion thereof.

According to a still further aspect of the invention, there is provided a method of making an information handling system including a circuitized substrate having a capacitive substrate therein as part thereof, said method comprising: forming a capacitive substrate including providing a first capacitive dielectric layer having first and second opposing sides, providing first and second conductors on said first and second opposing sides of said first capacitive dielectric layer, respectively, ink jet printing a second capacitive dielectric layer onto said first conductor on said first opposing side of said first capacitive dielectric layer, providing a third conductor on said second capacitive dielectric layer on said first conductor, forming a first thru-hole electrical connection between said second and third conductors, and forming a second thru-hole electrical connection between said first conductor and a fourth conductor, the first and second conductors and first capacitive dielectric layer forming a first capacitor and the first and third conductors and second capacitive dielectric layer forming a second capacitor when the capacitive substrate is operational; forming at least one dielectric layer and at least one conductive layer on opposite sides of said capacitive substrate to form a circuitized substrate having said capacitive substrate as an internal portion thereof; providing a housing having electrical circuitry therein and positioning said circuitized substrate within said housing and electrically coupling said circuitized substrate to said electrical circuitry, said housing, electrical circuitry and circuitized substrate forming an information handling system.

BEST MODE OF CARRYING OUT THE INVENTION

Figure 1:
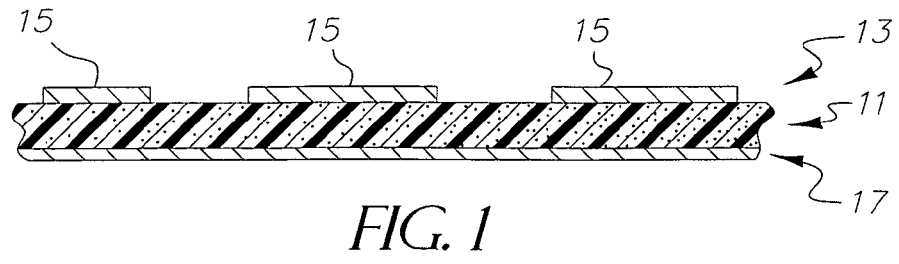
FIGS. 1-5 illustrate the steps of making a capacitive substrate according to one aspect of the invention, FIG. 5 being on an enlarged scale over FIGS. 1-4.

For a better understanding of the present invention, together with other and further objects, advantages and capabilities thereof, reference is made to the following disclosure and appended claims in connection with the above-described drawings. Like figure numbers may be used from FIG. to FIG. to identify like elements in these drawings.

By the term "capacitive substrate" as used herein is meant a substrate including at least two capacitive dielectric layers and at least three conductors, which combine to form at least two capacitors. Such substrates, in the simplest form, are adapted for being used as a substrate having other electrical components electrically coupled thereto, e.g., to form an electrical assembly. In the preferred embodiments, however, the capacitive substrates as formed in accordance with the teachings herein are preferably incorporated within a larger substrate structure to form a circuitized substrate such that the capacitive substrate is an internal structure of the larger circuitized substrate. As defined, more than one of these circuitized substrates may be included within the larger circuitized substrate.

By the term "circuitized substrate" as used herein is meant to include substrates having at least two (and preferably more) dielectric layers and at least two (and preferably more) metallurgical conductive layer(s), in addition to at least one capacitive substrate as part thereof. Examples include structures made of dielectric materials such as fiberglass-reinforced epoxy resins (some referred to as "FR-4" dielectric materials in the art), polytetrafluoroethylene (Teflon), polyimides, polyamides, cyanate resins, photo-imageable materials, and other like materials wherein the conductive layers are each a metal layer (e.g., power, signal and/or ground) comprised of suitable metallurgical materials such as copper, but may include or comprise additional metals (e.g., nickel, aluminum, etc.) or alloys thereof. These dielectric materials are understood to be different than the capacitive dielectric layers used in the capacitive substrates taught herein. Further examples will be described in greater detail herein-below. If the dielectric materials for the structure are of a photo-imageable material, it is photo-imaged or photo-patterned, and developed to reveal the desired circuit pattern, including the desired opening(s) as defined herein, if required. The dielectric material may be curtain-coated or screen-applied, or it may be supplied as dry film. Final cure of the photo-imageable material provides a toughened base of dielectric on which the desired electrical circuitry is formed. An example of a particularly useful photo-imageable dielectric is ASMDF (Advanced Soldermask Dry Film). This composition, which is further described in U.S. Pat. No. 5,026,624, which issued Jun. 25, 1991, and U.S. Pat. No. 5,300,402, which issued Apr. 25, 1994, includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photo-initiator; 0.07% ethylviolet dye; 0.03% FC 430, a fluorinated polyether nonionic surfactant from 3M Company; 3.85% Aerosil 380, an amorphous silicon dioxide from Degussa to provide the solid content. A solvent is present from about 11 to about 13.5% of the total photo-imageable dielectric composition. Examples of circuitized substrates include those usable for printed circuit boards (or cards) and chip carriers. It is believed that the teachings of the instant invention are also applicable to what are known as "flex" circuits (which use dielectric materials such as polyimide) and those which use ceramic or other non-polymer type dielectric layers, one example of the latter being what are referred to as multi-layered ceramic (MLC) modules adapted for having one or more semiconductor chips mounted thereon.

By the term "electrical component" as used herein is meant components such as semiconductor chips and the like which are adapted for being positioned on the external conductive surfaces of such substrates and electrically coupled to the substrate for passing signals from the component into the substrate whereupon such signals may be passed on to other components, including those mounted also on the substrate, as well as other components such as those of a larger electrical system in which the substrate is positioned.

By the term "electrical assembly" is meant at least one circuitized substrate as defined herein in combination with at least one electrical component electrically coupled thereto and forming part of the assembly. Examples of known such assemblies include chip carriers which include a semiconductor chip as the electrical component, the chip usually positioned on the substrate and coupled to wiring (e.g., pads) on the substrate's outer surface or to internal conductors using one or more thru-holes. Perhaps the most well known such assembly is the conventional printed circuit board (PCB) typically having several external components such as chip carriers, semiconductor chips, etc. mounted thereon and coupled to the internal circuitry of the PCB.

By the term "ferroelectric ceramic" as used herein is meant ceramics that possess ferroelectric properties. These include barium titanate, substituted barium titanate, strontium titanate, lead titanate, lead zirconate titanate, substituted lead zirconate titanate, lead magnesium niobate, lead zinc niobate, lead iron niobate, solid solutions of lead magnesium niobate and lead titanate, solid solutions of lead zinc niobate and lead titanate, lead iron tantalite, other ferroelectric tantalates, and combinations or mixtures thereof.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc. Such systems typically include one or more PCBs, chip carriers, etc. as integral parts thereof. For example, a PCB typically used includes a plurality of various components such as chip carriers, capacitors, resistors, modules, etc. mounted thereon. One such PCB may be referred to as a "motherboard" while various other boards (or cards) may be mounted thereon using suitable electrical connectors.

By the term "ink jet printing" as used herein is meant to include conventional ink jet printing processes as used today to deposit inks onto designated targets. Equipment used for this purpose typically includes a plurality of print heads which direct the ink "spray" onto the targets.

By the term "nano-particles" is meant particles with a size of from about 0.01 micron (ten nanometers) to about one micron (1000 nanometers). By the term "micro-particles" is meant particles having a size of from about one micron (1000 nanometers) to about five microns (5000 nanometers). The capacitive material powders used to form the screen printed or ink jet printed capacitive dielectric layers herein are understood to include particles of one or both of these sizes.

By the term "screen printing" as used herein is meant to include both screen and stencil printing processes as conventionally used today. These involve the use of a screen or stencil through which a desired material, e.g., inks, conductive compositions, etc., are deposited, e.g., using a squeegee.

By the term "thru-hole" as used herein is meant to include what are also commonly referred to in the industry as "blind vias" which are openings typically from one surface of a substrate to a predetermined distance therein, "internal vias" which are vias or openings located internally of the substrate and are typically formed within one or more internal layers prior to lamination thereof to other layers to form the ultimate structure, and "plated through holes" (also known as PTHS), which typically extend through the entire thickness of a substrate. All of these various openings form electrical paths through the substrate and often include one or more conductive layers, e.g., plated copper, thereon. Alternatively, such openings may simply include a quantity of conductive paste or, still further, the paste can be additional to plated metal on the opening sidewalls. These openings in the substrate are formed typically using mechanical drilling or laser ablation, following which the plating and/or conductive paste are be added.

In FIG. 1, a layer 11 of capacitive dielectric material is provided. In a preferred embodiment, this material is a combination of a cycloaliphatic epoxy resin, hexahydro-4-methylphthalic anhydride, dimethyl benzylamine and an epoxy novolac resin. A preferred cycloaliphatic epoxy resin is one sold under product designation "ERL-4211" by the Union Carbide Corporation, Danbury, Conn. A preferred epoxy novalac resin is one sold under product designation "LZ 8213", by Huntsman, Salt Lake City, Utah. Included as part of this material is a quantity of barum titanate powder, a ferroelectric ceramic material such as mentioned. Examples of how this capacitive dielectric material is formed are provided below, as are other examples of such material. (It is understood that the invention is not limited to use of these specific materials as others known in the art are also usable in the invention, as are other proportions thereof.) The defined powders used herein include nano-particles and/or micro-particles, to assure the extremely small thicknesses attained. The capacitive dielectric layer is bonded to a conductive layer 13, preferably of copper or copper alloy. In one embodiment, such bonding is accomplished when layer 11 is deposited atop layer 13 either in paste form using a screen printing operation or in ink form using a inkjet printing operation. Layer 11 may also be deposited in liquid form, using, for example, curtain, roller or draw down coating methods. If deposited as a paste, the paste is then substantially fully cured over its deposition state. In one embodiment, such curing occurs for a predetermined time period (in one example, for a period of from about 100 minutes to about 140 minutes, and preferably at 120 minutes) at a predetermined temperature within the range of from about 180 degrees Celsius (C) to about 200 degrees C., preferably 190 degrees C. Alternatively, layer 11 may be of solid film form and bonded to conductive layer 13 using conventional PCB lamination processing. In one embodiment, conductive layer 13 is formed from a single sheet of material. In this embodiment, layer 11 may possess a thickness of from about 0.1 mil to about five mils (a mil being one-thousandths of an inch) while conductor 13 includes a thickness of from about 0.2 mils to about 2.5 mils.

Once both capacitive dielectric layer 11 and conductive layer 13 are bonded together, at least one (and preferably more) individual conductor(s) 15 is(are) formed. For ease of explanation, description will only involve the center conductor 15, but it is understood that the other conductors 15 may also function in the same manner (as part of a capacitor) as center conductor 15. Conductor 15 is to become an electrode for a capacitor, as explained below, and is preferably formed using conventional photolithographic processing used in the PCB industry to form circuit patterns on dielectric layers. Further description is not deemed necessary. In the broadest aspects of this invention, it is possible to bond conductive layer 13 to layer 111 in the form of a single conductor 15, e.g., where the conductor is a solid copper element.

On the bottom surface of layer 11 is bonded a second conductive layer 17, preferably of the same metal as layer 13, and of a thickness of from about 0.1 mil to about 2.5 mils. Layer 17 is preferably a solid sheet of copper and bonded to layer 11 using conventional PCB lamination. It is possible to bond both conductive layers 13 and 17 to interim capacitive dielectric layer 11 simultaneously, e.g., using PCB lamination. If accomplished in this manner, layer 13 is then subjected to the described photolithographic processing following the lamination process. Alternatively, layers 13 and 17 may be individually formed using conventional sputtering processing followed by electroplating. During such sputtering, a thin layer of metal, preferably copper, is vacuum deposited on layer 11, preferably at a thickness of about 0.5 microns to about five microns, a most preferred thickness being about one micron. Sputtering may also include a barrier metal layer prior to the copper layer. The barrier layer is typically comprised of chrome or titanium with a thickness of 50 Angstroms to about 500 Angstroms. The sputtered copper layer is used as a seed layer for subsequent copper electroplating. The preferred electroplating process, if used, is pattern plating whereby a layer of photo-resist is applied to the sputtered copper layer and, in the case of layer 13, imaged and developed in the desired pattern (for conductors 15). Electroplating of layer 13 then occurs in the developed photo-resist openings, and, in the case of layer 17, over the entire sputter initial layer. Following electrolytic pattern plating, the photo-resist on layer 13 is stripped away and then the thin sputtered copper and barrier metal, if applicable, are etched.

Figure 2:
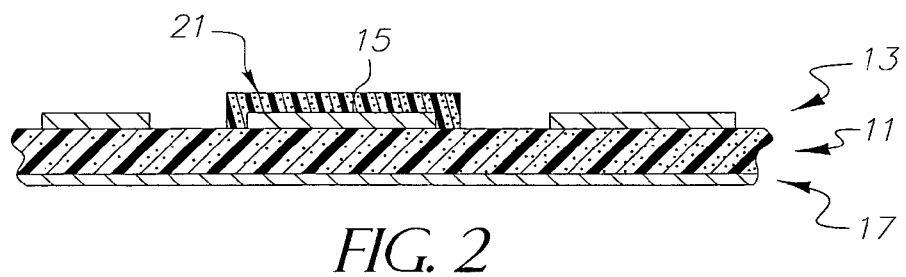

In FIG. 2, a quantity of capacitive dielectric material 21 is either screen printed or ink jet printed onto conductor 15 of the structure of FIG. 1 to a thickness of from about 0.05 mils to about two mils. Material 21 is preferably of the same material as layer 11 in paste or similar liquid form capable of being screen printed or ink jet printed using conventional equipment for performing such processes. In one embodiment, the capacitive powder is barum titanate powder, a ferroelectric ceramic material as mentioned, having particles within the defined nano-particle range. This powder may also include micro-particle sized particles either in combination with the nano-particle sized particles or individually as only micro-particles. Further examples are defined below. Following deposition, the printed dielectric capacitive material is preferably cured, at a temperature within the range of from about 180 degrees C. to about 200 degrees C. for a time period of from about 100 minutes to about 140 minutes. This is preferably accomplished by placing the FIG. 2 structure within a suitable convection oven. It should be noted that material 21 need not be fully cured at this time, and that the above heating step is not necessary if the following alternative procedure for curing is used.

Figure 3:
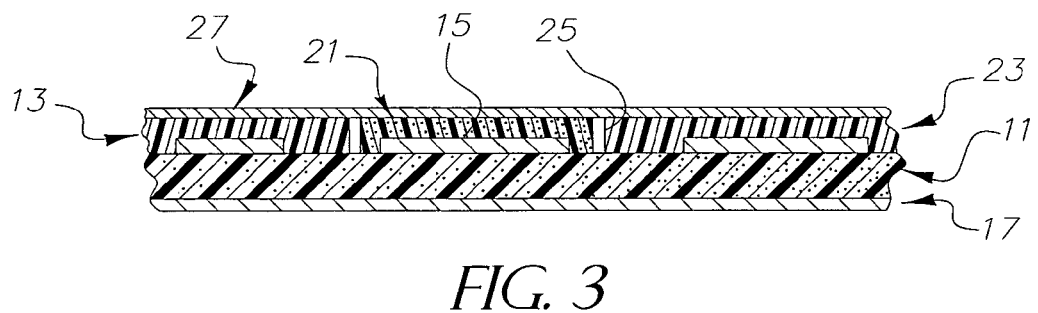

In FIG. 3, an apertured dielectric layer 23 is positioned over the FIG. 2 structure. Layer 23 has a thickness of from about 0.2 mils to about five mils and includes an opening 25 therein of a size slightly larger than the corresponding size of material 21. In one embodiment, the opening may possess an internal diameter only about 0.001 inch greater than the corresponding diameter of material 21. This slight enlargement is shown in exaggerated form in FIG. 3, for illustration purposes. Opening 25 is preferably formed using laser ablation or mechanical drilling. As understood, if the other conductors 15 are also to serve as capacitor electrodes, corresponding openings (not shown) are similarly provided for each. Layer 23 is preferably bonded to the FIG. 2 structure using conventional PCB lamination. As a result of such lamination, the capacitive dielectric material 21, as well as the now-apertured dielectric layer 23, expand laterally to fill the opening 25. If sufficient temperatures are used for the lamination, the heat generated will also serve to substantially cure material 21 (including further cure it if it is already partially cured, e.g., from a heating step as mentioned above). Following placement of layer 23, a third conductive layer 27 is formed on layer 23. Layer 27 is preferably of the same material as conductors 15 and layer 17, e.g., copper or copper alloy, and has a thickness of from about 0.1 mils to about 2.5 mils. Layer 27 may be formed using a sputtering-plating operation as defined above or may be provided in the form of a solid sheet of copper or copper alloy and laminated to the underlying dielectric 23. It is also within the scope of this invention to bond layers 23 and 27 together to form a laminate structure (with opening 25 preferably formed prior to the bonding) and this laminate in turn laminated to the FIG. 2 structure, e.g., using conventional PCB lamination processing. If so, the pressure applied onto the elements during such lamination is preferably from about 200 pounds per square inch (p.s.i.) to about 2000 p.s.i. The structure of FIG. 3 will preferably possess an overall thickness of from about three mils to about twenty-five mils, ideally suited for further substrate processing in which the structure will form part of a thicker structure having more layers as part thereof.

Figure 4:
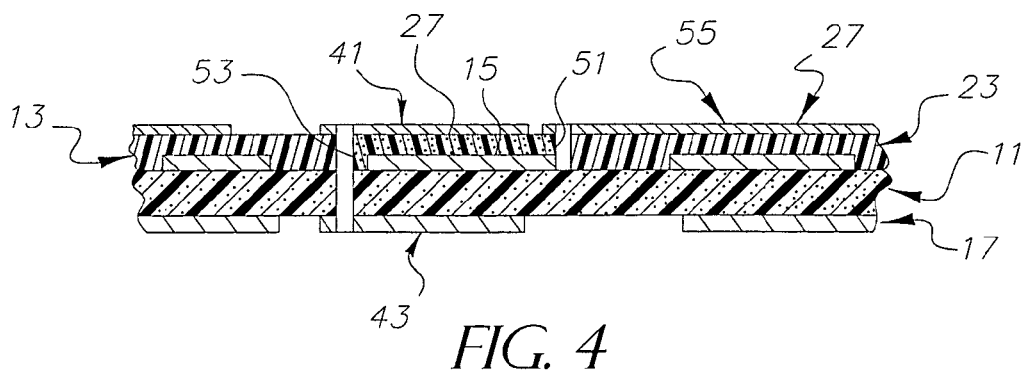
Figure 5:
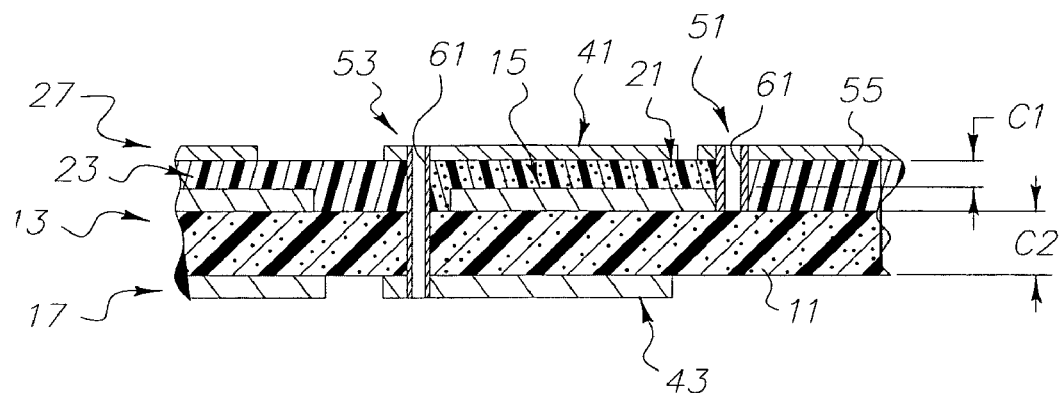

FIG. 4 represents the next steps in making a capacitive substrate according to one embodiment of the invention. Firstly, the outer layers 17 and 27 are "circuitized', meaning that individual conductors are formed from the original sheets (layers) of material which forms said layers. Such circuitization is preferably accomplished using conventional PCB photolithographic processing, and further description is not deemed needed. As a result, at least two conductors 41 and 43 are formed, these two to also be electrodes for the capacitors formed herein. Conductors 41 and 43 are preferably of the same size, having a diameter of from about eight mils to about 1000 mils. These are thus of substantially the same size as the interim conductor 15. Conductors 41 and 43 and interim conductor 15 do not have to be circular, but can be of any desired shape. Holes 51 and 53 are now formed, preferably using mechanical or laser drilling. Hole 53 extends through conductors 41 and 43, in addition to through the two interim capacitive dielectric layers 11 and 21. Hole 51 extends through a fourth conductor (layer) 55 and dielectric layer 23, to engage interim conductor 15 as shown. Laser drilling for holes 51 and 53 is possible if the conductors though which these extend are thin enough. Following formation of the holes, each is plated in which a first thin layer of palladium seed is applied, followed by a thin layer of electro-less copper and finally a thicker layer of electrolytic copper. In one embodiment, the total thickness of both copper layers combined is 0.5 mils. As is understood, other metallurgies and thicknesses are possible. It is further understood that holes 51 and 53 can be formed and plated prior to formation of conductors 41 and 43. The plating is shown as a single layer in FIG. 5 and represented by the numeral 61 for both holes. Alternatively, it is possible to fill the unplated holes with conductive paste, such pastes known in the art. These pastes can also be added to the already plated holes if desired, for even more enhanced connectivity. The result is the formation of thru-holes which couple the various parts of the FIG. 5 structure as shown. In one embodiment, each thru-hole preferably possesses a diameter of from about two mils to about eight mils, a preferred diameter being only three mils. Such extremely small diameters illustrate the relatively high densities attainable using the teachings of this invention.

Figure 6:
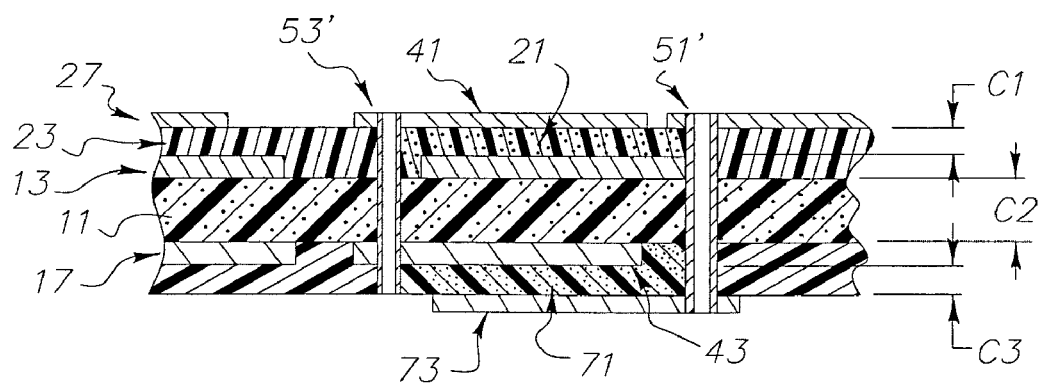
FIG. 6, on the same scale as FIG. 5, illustrates one embodiment of making a capacitive substrate which includes at least one additional capacitor over the embodiment shown in FIG. 5.

FIGS. 1-5 thus depict the formation of at least two capacitors C1 and C2. In one example, C1 may have a value of 1 $nF/inch^2$, while C2 may possess a value of 100 $nF/inch^2$. Capacitor C1 is shown to comprise electrodes 15 and 41, while capacitor C2 comprises electrodes 15 and 43. The invention is not so limited, however, as it is within the scope of this invention to provide more than two capacitors within a structure such as that shown in FIG. 5. This is accomplished by adding a third layer of capacitive dielectric material 71 and another conductor (electrode) 73, as shown in FIG. 6. This also includes the positioning (e.g., laminating) of another dielectric layer adjacent material 71, shown in FIG. 6 as having a different cross-section. This adjacent (and preferably surrounding outer dielectric layer is applied to the underside of the FIG. 5 structure, preferably in the same manner as layer 23 is applied. A conductive layer which eventually results in conductor 73 may also be bonded or otherwise formed (e.g., using sputtering as defined above), with the conductor formed as a result of a photolithographic process. (The outer dielectric layer around material 71 will preferably include a slightly larger opening than did layer 23, to accommodate the also screen or ink jet printed material 71.) Thru-holes 51' and 53' are similarly formed as were thru-holes 51 and 53, but this time to extend to further depths within the capacitive substrate in order to couple to the illustrated elements. Because the addition of the new elements in FIG. 6 is preferably accomplished in the same manner as the previous elements in FIGS. 1-5, further definition is not considered necessary.

The resulting capacitive substrate of FIG. 6 is thus shown to include at least three capacitors C1, C2 and C3. Capacitors C1 and C2 may have the capacitances of capacitors C1 and C2 above, while C3 may have a value of 1 $nF/inch^2$. The addition of still further capacitive dielectric layers and conductors (electrodes) is also possible using similar teachings. In the embodiment as illustrated in FIG. 6, it is possible to form as many as 10,000 capacitors within the resulting capacitive substrate. This represents a significant aspect of the invention because it assures that a final circuitized substrate desiring such a number of internal capacitor elements will be able to have these readily incorporated therein without the necessity of individual capacitor formation prior to incorporation, and the undesirable additional costs associated with same. The number of capacitors formed, of course is dependent on the substrate size, the capacitor values desired and the desired function of the finished substrate.

According to the unique teachings of the instant invention, it is possible to vary the capacitance values of the capacitors formed by varying the thicknesses of the capacitance dielectric materials and/or the materials themselves. The Examples cited below represent various materials which can be used, and the TABLES below represent the various capacitance values when using alternative thicknesses and materials. This represents a significant aspect of this invention because it enables the substrate manufacturer to meet the operational requirements of many circuit designs by simply providing different capacitance dielectric materials and/or modifying the thicknesses thereof. A further significant aspect of the invention is that the capacitors formed may be connected to each other with the plated thru holes and/or circuit features on the conductor layers. These connections can be either series or parallel connections. Thus, with the various electrode sizes, dielectric materials and thicknesses, an infinite number of capacitor values can be achieved in a single substrate. Each of the TABLES 1-4 below illustrate two or more different capacitor dielectric materials, laminated together using conventional FR4 pre-preg material, and the resulting capacitor value of a 0.1 inch square capacitor with either series or parallel connection.

TABLE 1

Two different capacitors connected either in series or parallel. Here screen printable discrete capacitors (C1) connected with layer capacitors (C2)

| Capacitors | Capacitance Density (nF/inch$^2$) | (0.1" × 0.1") Capacitor (pF) | Total capacitor through series connection (1/C = 1/C1 + 1/C2) | Total capacitor through parallel connection (C = C1 + C2) |
|---|---|---|---|---|
| C1 | 16 | 160 | 58 pF | 250 pF |
| C2 | 9  | 90  |       |        |

TABLE 2

Three different capacitors connected either in series or parallel. Here two screen printable discrete capacitors (C1 & C3) connected with layer capacitors (C2).

| Capacitors with Capacitance Density (nF/inch$^2$) | (0.1" × 0.1") Capacitor (pF) | All capacitors connected through parallel connection C = C1 + C2 + C3 | Parallel connection with C1, C2. C = C1 + C2 | Parallel connection with C3, C2. C = C3 + C2 | Series connection with C3, C1. 1/C = 1/C1 + 1/C3 | Parallel connection with C3, C1. C = C3 + C1 |
|---|---|---|---|---|---|---|
| C1, 16  | 160 | 305 pF | 250 pF | 145 pF | 41 pF | 215 pF |
| C2, 9   | 90  |        |        |        |       |        |
| C3, 5.5 | 55  |        |        |        |       |        |

TABLE 3

Three different capacitors connected either in series or parallel. Here two screen printable discrete capacitors (C1 & C3) connected with layer capacitors (C2). Discrete capacitor (C4) connected with another discrete capacitors (C3).

| Capacitors with Capacitance Density (nF/inch$^2$) | (0.1" × 0.1") Capacitor (pF) | All capacitors connected through parallel connection C = C1 + C2 + C3 + C4 | Parallel connection with C1, C2. (C1 + C2) have series connection with C4. 1/C = 1/(C1 + C2) + 1/C4 | Parallel connection with C3, C4. (C3 + C4) have series connection with C1. 1/C = 1/(C3 + C4) + 1/C1 | series connection with C2, C4 1/C = 1/C2 + 1/C4 |
|---|---|---|---|---|---|
| C1, 16  | 160 | 505 pF | 111 pF | 98 pF | 68 pF |
| C2, 9   | 90  |        |        |       |       |
| C3, 5.5 | 55  |        |        |       |       |
| C4, 20  | 200 |        |        |       |       |

TABLE 4

Materials with different composition, thickness and capacitance density and thickness

| Materials/Particle size | Thickness (microns) | Capacitance Density (nF/inch$^2$) |
|---|---|---|
| BaTiO$_3$ (120 nm + 65 nm)/Polymer (Epoxy Novolac + PKHC) | 2.5 microns | 80 nF/inch$^2$ |
| BaTiO$_3$ (120 nm + 65 nm)/Polymer (Epoxy Novolac + PKHC) | 5 microns | 40 nF/inch$^2$ |
| BaTiO$_3$ (120 nm)/Polymer (Epoxy Novolac + PKHC) | 8.5 microns | 25 nF/inch$^2$ |
| BaTiO$_3$ (120 nm)/Polymer (Epoxy Novolac + PKHC) | 25 microns | 9 nF/inch$^2$ |
| BaTiO$_3$ (120 nm) + TiO$_2$ (10 nm)/Polymer (Epon + PKHC) | 5 microns | 15 nF/inch$^2$ |

Figure 7:
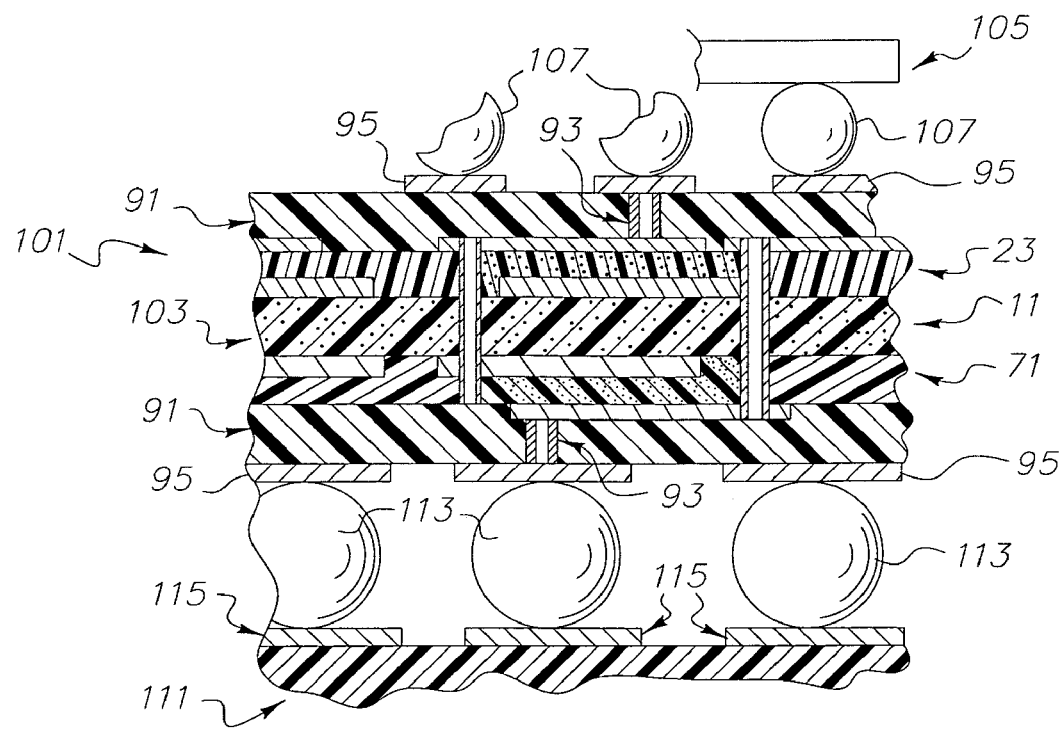
FIG. 7, on a smaller scale than FIGS. 5 and 6, illustrates examples of at least two embodiments of electrical assemblies which may include one or more of the capacitive substrates produced in accordance with the teachings herein.

FIG. 7 represents the addition of at least one more dielectric layer 91 atop each of the outer layers of the FIG. 6 substrate structure, the formation of additional thru-holes 93 (only two shown) for interconnecting selected elements of the structure, and the formation of outer conductor pads 95. The upper pads may be larger than the lower pads. The structure is a circuitized substrate which includes as part thereof a capacitive substrate such as formed in FIG. 6. The circuitized substrate, with this internal capacitive substrate, is thus able to provide internal capacitance for the structure when used with other electrical components. In FIG. 7, the circuitized substrate, referenced by the numeral 101, includes the internal capacitive substrate, referenced by the numeral 103, in addition to the added dielectric and conductive pads. Dielectric layers 91 may be of the same dielectric materials defined above, one example being fiber-glass reinforced epoxy resin (also known as FR4 material). Pads 95 are preferably copper or copper alloy. It is understood that, according to the definition provided above, substrate 101 will form part of an electrical assembly when an electronic component such as a semiconductor chip 105 is mounted thereon (i.e., using conventional solder balls 107). Likewise, the substrate 101 will form part of an electrical assembly when mounted on a lower substrate such as a larger PCB 111 (i.e., also using solder balls 113 onto pads 115 on the PCB). Notably, some numbers are omitted in FIG. 7 for ease of illustration, but are understood to be the same as those in previous FIG. 6. It is understood that the holes 51' and 53' of FIG. 6 do not need to be formed at that point of the process, but could also be formed as complete thru holes and formed simultaneously with holes 93 of FIG. 7. If so, holes 51' and 53' would of course extend through the outer layers 91 and may or may not be directly coupled to one or more external conductors (i.e., conductor 95 to the lower right in FIG. 7).

The following Examples represent various combinations of capacitor dielectric materials and processes used to form capacitors according to various aspects of the invention. These are understood to be examples only and not limiting of the scope of this invention. Examples One to Four represent discrete capacitive dielectric material (i.e. material 21), whereas Examples Five to Ten represent capacitive dielectric material (i.e., 11) in FIGS. 1-6.

EXAMPLE ONE

Fifty grams (gm) of cycloaliphatic epoxy resin (e.g., one sold under product designation "ERL-4211" by the Union Carbide Corporation, Danbury, Conn.) was mixed with about fifty grams (gm) of hexahydro-4-methylphthalic anhydride and 0.4 gm N, N dimethyl benzylamine. The mixed solution was stirred for ten minutes to assure uniform mixing. Sixty gm of barium titanate ($BaTiO_3$) powder available from the Nippon Chemical Industrial Co., Ltd., of Tokyo, Japan was added to 17.5 gm of the mixed solution and formed into a screen printable paste. A layer of this material was screened through a 145 mesh screen onto the top surface of a copper conductor. This layer was then cured at approximately 150° C. for about two hours. The second electrical conductor was then formed using a sputtering operation atop the cured screen printed material using a mask normally used for such sputtering operations. The resulting capacitance density of the formed capacitor measured about 5.5 nano-Farads (nF)/square inch, with a dielectric loss of only about 0.02 at 1 Mega-Hertz (MHz). The average (mean) particle size for the added powder was about 0.5 micron, the surface area about 2.65 square meters/gm, and the specific gravity about 5.30.

EXAMPLE TWO

As in Example One, fifty grams (gm) of "ERL-4211" cycloaliphatic epoxy resin was mixed with about fifty gm of hexahydro-4-methylphthalic anhydride and 0.4 gm N, N dimethyl benzylamine. The mixed solution was stirred for ten minutes to assure uniform mixing. 100 gm of barium titanate ($BaTiO_3$) powder available from the Nippon Chemical Industrial Co., Ltd., of Tokyo, Japan was added to 21 gm of the mixed solution and formed into a screen printable paste. A layer of this material was screened through a 200 mesh screen onto the top surface of a copper conductor. This layer was then cured at approximately 190° C. for about two hours. The second electrical conductor was then formed using a sputtering operation atop the cured screen printed material using a mask normally used for such sputtering operations. The resulting capacitance density of the formed capacitor measured about 16 nano-Farads (nF)/square inch, with a dielectric loss of only about 0.02 at 1 Mega-Hertz (MHz). The average (mean) particle size for the added powder was about 0.69 micron and the surface area about 2.02 square meters/gm.

EXAMPLE THREE

Fifty grams (gm) of an epoxy resin sold under the product name "LMB7259" from Huntsman, Salt Lake City, Utah was mixed together with 175 gm of barium titanate (BaTiO3) powder available from Nippon Chemical Industrial Co., Ltd. and twenty eight gm propylene glycol methyl ether acetate. The mixed solution was stirred for ten minutes to assure uniform mixing and made into a screen printable paste. A layer of this paste material was screened through a 200 mesh screen onto the top surface of a copper first electrical conductor. This layer was then cured at approximately 190° C. for about two hours, as in Example Two. The second electrical conductor was then formed using a sputtering operation atop the cured screen printed material using a mask normally used for such sputtering operations. The average (mean) particle size for the added powder was about 0.5 micron, the surface area about 2.65 square meters/gm, and the specific gravity about 5.30.

EXAMPLE FOUR

Fifty grams (gm) of "ERL-4211" cycloaliphatic epoxy resin was mixed with about fifty gm of hexahydro-4-methylphthalic anhydride, 0.4 gm N,N dimethyl benzylamine and twenty gm of an epoxy novolac resin (e.g. one sold under product designation "LZ 8213", by Huntsman, Salt Lake City, Utah). The mixed solution was stirred for thirty minutes to assure uniform mixing. 120 gm of Nippon Chemical Industrial's barum titanate powder was added to 56 gm of the mixed solution and formed into a screen printable paste. A layer of this material was screened through a 200 mesh screen onto the top surface of a copper first electrical conductor. This layer was then cured at approximately 150° C. for about two hours, followed by an additional cure at approximately 190° C. for about one hour. The second electrical conductor was then formed using a sputtering operation followed by a copper electroplating process and a photolithographic etch step. The resulting capacitance density of the formed capacitor measured about 5.5 nano-Farads (nF)/square inch, with a dielectric loss of only about 0.02 at 1 mega-Hertz (mHz). The average (mean) particle size for the added powder was about 0.5 micron, the surface area about 2.65 square meters/gm, and the specific gravity about 5.30.

EXAMPLE FIVE 38.5 grams (gm) of an epoxy novolac resin sold under the product name "LZ 8213" from Huntsman, Salt Lake City, Utah, containing about 35 wt % methyl ethyl ketone and 6.5 gm of a phenoxy resin sold under the product name "PKHC" from Phenoxy Associates, Rock Hill, S.C., containing 50 wt % methyl ethyl ketone were mixed together with 100 gm of barium titanate (BaTiO3) powder available from Cabot Corporation, Boyertown, Pa. ((50 gm BaTiO3 with a mean particle size=0.065 micron, surface area=16 m2/gm) and (50 gm BaTiO3 with mean particle size=0.12 micron, surface area=8.2 m2/gm)), thirteen gm propylene glycol methyl ether acetate) and twelve gm methyl ethyl ketone) and ball milled for three days. Around 2.5 micron thin film of this mixed composite was then deposited onto a copper substrate and dried at approximately 140° C. for three minutes in an oven to remove residual organic solvents. This was followed by curing in an oven at 190° C. for two hours. A second electrical conductor was then formed using a sputtering operation atop the cured film using a mask normally used for such sputtering operations. The resulting capacitance density of the formed capacitor measured about 80 nano-Farads (nF)/square inch at 1 Mega-Hertz (MHz).

EXAMPLE SIX 38.5 grams (gm) of an epoxy novolac resin sold under the product name "LZ 8213" from Huntsman, Salt Lake City, Utah, containing about 35 wt % methyl ethyl ketone and 6.5 gm of a phenoxy resin sold under the product name "PKHC" from Phenoxy Associates, Rock Hill, S.C., containing 50 wt % methyl ethyl ketone were mixed together with 100 gm of barium titanate (BaTiO3) powder available from Cabot Corporation, Boyertown, Pa. ((50 gm BaTiO3 with a mean particle size=0.065 micron, surface area=16 m2/gm) and (50 gm BaTiO3 with mean particle size=0.12 micron, surface area=8.2 m2/gm)), thirteen gm propylene glycol methyl ether acetate) and twelve gm methyl ethyl ketone) and ball milled for three days. Around 12.5 micron thin film of this mixed composite was then deposited on a copper substrate and dried at approximately 140° C. for three minutes in an oven to remove residual organic solvents. Two 12.5 micron dried thin films were then laminated with each other at 190° C. with 200 p.s.i. pressure for two hours to produce around 25 micron laminates. The resulting capacitance density of the laminated capacitor measured about 9 nano-Farads (nF)/square inch at 1 Mega-Hertz (MHz).

EXAMPLE SEVEN

Fifty gm of "LZ 8213" epoxy novolac resin containing about 35 wt % methyl ethyl ketone was mixed together with fifty gm of barium titanate powder (available from the Nippon Chemical Industrial Co., Ltd., of Tokyo, Japan) having a mean particle size of 0.5 micron and particle surface area of about 2.65 $m^2$/gm and twenty gm methyl ethyl ketone, and ball milled for three days until a homogeneous slurry was observed. Around 2.5 micron thin film of this mixed composite was then deposited onto a copper substrate and dried at approximately 140° C. for three minutes in an oven to remove residual organic solvents. This was followed by curing in an oven at 190° C. for two hours. A second electrical conductor was then formed using a sputtering operation atop the cured film using a mask normally used for such sputtering operations. The resulting capacitance density of the formed capacitor measured about 20 nano-Farads (nF)/square inch at 1 Mega-Hertz (MHz).

EXAMPLE EIGHT

Ninety gm of a combination of barium titanate, calcium titanate and zirconium powders (also available from the Nippon Chemical Industrial Co., Ltd. Tokyo, Japan) powder having a mean particle size of about 0.2 micron and surface area of about 8.25 $m^2$/gm was mixed with thirty gm of "LZ 8213" epoxy novolac resin containing about 35 wt % methyl ethyl ketone and thirty gm methyl ethyl ketone and ball milled for three days, until an homogeneous slurry was observed. Around 2.5 micron thin film of this mixed composite was then deposited onto a copper substrate and dried at approximately 140° C. for three minutes in an oven to remove residual organic solvents. This was followed by curing in an oven at 190° C. for two hours. A second electrical conductor was then formed using a sputtering operation atop the cured film using a mask normally used for such sputtering operations. The resulting capacitance density of the formed capacitor measured about 42.5 nano-Farads (nF)/square inch at 1 Mega-Hertz (MHz).

EXAMPLE NINE

Fifty gm of a combination of barium titanate, calcium titanate and zirconium powders (also available from the Nippon Chemical Industrial Co., Ltd. Tokyo, Japan) powder having a mean particle size of about 0.2 micron and surface area of about 8.25 $m^2$/gm was mixed with fifty gm of "LZ 8213" epoxy novolac resin containing about 35 wt % methyl ethyl ketone and 44 gm methyl ethyl ketone and ball milled for three days, until an homogeneous slurry was observed. Around 2.5 micron thin film of this mixed composite was then deposited on a copper substrate and dried at approximately 140° C. for three minutes in an oven to remove residual organic solvents. This was followed by curing in an oven at 190° C. for two hours. A second electrical conductor was then formed using a sputtering operation atop the cured film using a mask normally used for such sputtering operations. The resulting capacitance density of the formed capacitor measured about 32.5 nano-Farads (nF)/square inch at 1 Mega-Hertz (MHz).

EXAMPLE TEN

Thirty gm of "LZ 8213" epoxy novolac resin containing about 35 wt % methyl ethyl ketone was mixed together with ninety gm of barium titanate powder (available from the Nippon Chemical Industrial Co., Ltd., of Tokyo, Japan) having a mean particle size of 0.1 micron and particle surface area of about 15.08 $m^2$/gm and 80 gm methyl ethyl ketone, and ball milled for three days until a homogeneous slurry was observed. Around 2.5 micron thin film of this mixed composite was then deposited on a copper substrate and dried at approximately 140° C. for three minutes in an oven to remove residual organic solvents. This was followed by curing in an oven at 190° C. for two hours. A second electrical conductor was then formed using a sputtering operation atop the cured film using a mask normally used for such sputtering operations. The resulting capacitance density of the formed capacitor measured about 42.5 nano-Farads (nF)/square inch at 1 Mega-Hertz (MHz).

Figure 8:
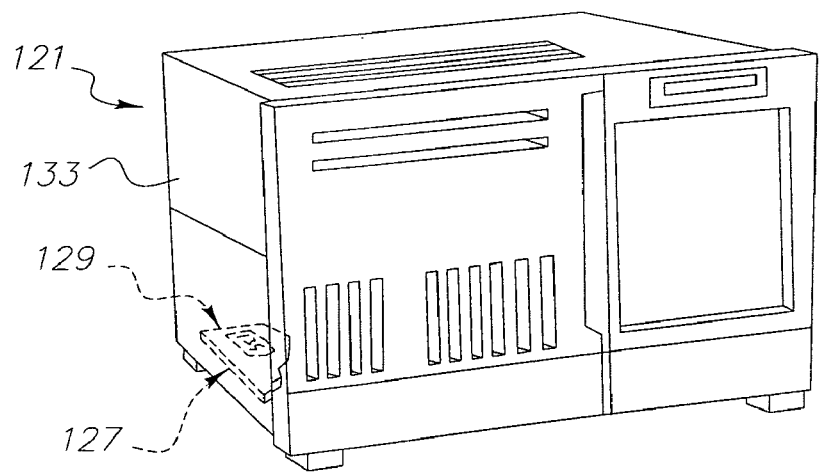
FIG. 8, on a much smaller scale than FIGS. 1-7, represents one embodiment of an information handling system adapted for utilizing one or more circuitized substrates including capacitive substrates of the present invention as part thereof.

In FIG. 8, there is shown an information handling system 121 which is preferably a personal computer, a mainframe computer or a computer server. Other types of information handling systems known in the art of this type may also utilize the teachings of this invention. The circuitized substrate or substrates as formed in accordance with the teachings herein, each including one or more internal capacitive substrates as taught above, may be utilized in the system 121 as a PCB 127 (shown hidden) and/or a chip carrier 129 (also shown hidden). The circuitized substrates may be utilized as a mother board in system 121 or as one or more individual PCBs typically utilized in such systems. As is known, systems 121 are usually contained within a suitable metal or insulative housing such as shown by the numeral 133, with appropriate venting (if desired) therein, as well as instrumentation externally accessible for system operation by the system's designated operator. Remaining elements of information handling systems of these types, e.g., microprocessors, keyboards (if used), memory cards (if used) and monitors (if used) are known in the art, as are the methods of assembling these elements together in combination with motherboards and other circuitized substrates such as taught herein. further description is thus not believed necessary.

Thus there has been shown and described a capacitive substrate having two or more capacitors as part thereof, which substrate can be formed using many conventional PCB processes to thereby reduce costs associated with production thereof. This capacitive substrate can then be incorporated into a larger circuitized structure, including by laminating other dielectric layers and forming other circuit elements as part thereof, if desired. There have also been defined several examples of capacitor dielectric materials which can be used between two or more opposing conductors as part of such a unique internal capacitor structure. The invention as defined herein, if desired, is capable of transmitting both regular and high speed (frequency) signals, the latter at a rate of from about one Gigabit/sec to about ten Gigabits/second, while substantially preventing impedance disruption. As stated, it is also capable of being produced using many conventional PCB processes so as to assure reduced cost and facilitate ease of manufacture. In one example, the methods taught herein preferably involve the use of conventional lamination processes in which dielectric and/or capacitive dielectric layers, having the designated circuitry and/or conductive elements (planes) thereon are "stacked up" in aligned manner with one another and subjected to relatively high pressures and temperatures associated with conventional lamination. Of further significance, the invention, able to utilize thru-holes and other elements of very fine definition, is able to assure highly dense circuit patterns as are deemed extremely important with regards to many of today's design requirements.

While there have been shown and described what at present are considered the preferred embodiments of the invention, it will be obvious to those skilled in the art that various changes and modifications may be made therein without departing from the scope of the invention as defined by the appended claims.

What is claimed is:

1. A method of making a capacitive substrate, said method comprising:
   providing a first capacitive dielectric layer having first and second opposing sides;
   providing first and second conductors on said first and second opposing sides of said first capacitive dielectric layer, respectively;
   screen printing a second capacitive dielectric layer onto said first conductor on said first opposing side of said first capacitive dielectric layer, said second capacitive dielectric layer including nano-particles and/or micro-particles therein;
   providing a third conductor on said second capacitive dielectric layer on said first conductor;
   forming a first thru-hole electrical connection between said second and third conductors; and
   forming a second thru-hole electrical connection between said first conductor and a fourth conductor, said first and second conductors and said first capacitive dielectric layer forming a first capacitor and said first and third conductors and said second capacitive dielectric layer forming a second capacitor when said capacitive substrate is operational.

2. The method of claim 1 wherein said first conductor is laminated onto said first capacitive dielectric layer, said laminating of said first conductor onto said first capacitive dielectric layer substantially curing said first capacitive dielectric layer.

3. The method of claim 1 wherein said first capacitive dielectric layer is screen printed onto said first conductor and thereafter substantially cured.

4. The method of claim 3 wherein said substantially curing of said first capacitive dielectric layer is accomplished at a temperature within the range of from about 180 degrees C. to about 200 degrees C. for a time period of from about 100 minutes to about 140 minutes.

5. The method of claim 1 wherein said second capacitive dielectric layer is substantially cured prior to said providing of said third conductor on said second capacitive dielectric layer.

6. The method of claim 5 wherein said substantially curing of said second capacitive dielectric layer is accomplished at a temperature within the range of from about 180 degrees C. to about 200 degrees C. for a time period of from about 100 minutes to about 140 minutes.

7. The method of claim 1 wherein said forming of said first thru-hole electrical connection between said second and third conductors is accomplished using a laser.

8. The method of claim 1 wherein said forming of said second thru-hole electrical connection between said first conductor and said fourth conductor is accomplished using a laser.

9. The method of claim 1 wherein said providing of said first, second and third conductors is accomplished using photolithographic processing.

10. A method of making a circuitized substrate having a capacitive substrate therein, said method comprising:
   forming a capacitive substrate including providing a first capacitive dielectric layer having first and second opposing sides, providing first and second conductors on said first and second opposing sides of said first capacitive dielectric layer, respectively, screen printing a second capacitive dielectric layer onto said first conductor on said first opposing side of said first capacitive dielectric layer, said second capacitive dielectric layer including nano-particles and/or micro-particles therein, providing a third conductor on said second capacitive dielectric layer on said first conductor, forming a first thru-hole electrical connection between said second and third conductors, and forming a second thru-hole electrical connection between said first conductor and a fourth conductor, said first and second conductors and said first capacitive dielectric layer forming a first capacitor and said first and third conductors and said second capacitive dielectric layer forming a second capacitor when said capacitive substrate is operational; and
   forming at least one dielectric layer and at least one conductive layer on opposite sides of said capacitive substrate to form a circuitized substrate having said capacitive substrate as an internal portion thereof.

11. The method of claim 10 wherein said forming of said at least one dielectric layer on said opposite sides of said capacitive substrate is accomplished using lamination.

12. The method of claim 10 wherein said forming of said at least one conductive layer on said opposite sides of said capacitive substrate is accomplished using photolithographic processing.

13. A method of making an information handling system including a circuitized substrate having a capacitive substrate therein as part thereof, said method comprising:
   forming a capacitive substrate including providing a first capacitive dielectric layer having first and second opposing sides, providing first and second conductors on said first and second opposing sides of said first capacitive dielectric layer, respectively, screen printing a second capacitive dielectric layer onto said first conductor on said first opposing side of said first capacitive dielectric layer, said second capacitive dielectric layer including nano-particles and/or micro-particles therein, providing a third conductor on said second capacitive dielectric layer on said first conductor, forming a first thru-hole electrical connection between said second and third conductors, and forming a second thru-hole electrical connection between said first conductor and a fourth conductor, said first and second conductors and said first capacitive dielectric layer forming a first capacitor and said first and third conductors and said second capacitive dielectric layer forming a second capacitor when said capacitive substrate is operational;
   forming at least one dielectric layer and at least one conductive layer on opposite sides of said capacitive substrate to form a circuitized substrate having said capacitive substrate as an internal portion thereof;
   providing a housing having electrical circuitry therein and positioning said circuitized substrate within said housing and electrically coupling said circuitized substrate to said electrical circuitry, said housing, electrical circuitry and circuitized substrate forming an information handling system.

14. The method of claim 13 wherein said information handling system comprises a personal computer.

15. The method of claim 13 wherein said information handling system comprises a computer server.

16. The method of claim 13 wherein said information handling system comprises a mainframe computer.

17. A method of making a capacitive substrate, said method comprising:
provide a first capacitive dielectric layer having first and second opposing sides;
providing first and second conductors on said first and second opposing sides of said first capacitive dielectric layer, respectively;
ink jet printing a second capacitive dielectric layer onto said first conductor on said first opposing side of said first capacitive dielectric layer, said second capacitive dielectric layer including nano-particles and/or micro-particles therein;
providing a third conductor on said second capacitive dielectric layer on said first conductor;
forming a first thru-hole electrical connection between said second and third conductors; and
forming a second thru-hole electrical connection between said first conductor and a fourth conductor, said first and second conductors and said first capacitive dielectric layer forming a first capacitor and said first and third conductors and said second capacitive dielectric layer forming a second capacitor when said capacitive substrate is operational.

18. A method of making a circuitized substrate including a capacitive substrate as part thereof, said method comprising:
forming a capacitive substrate including providing a first capacitive dielectric layer having first and second opposing sides, providing first and second conductors on said first and second opposing sides of said first capacitive dielectric layer, respectively, ink jet printing a second capacitive dielectric layer onto said first conductor on said first opposing side of said first capacitive dielectric layer, said second capacitive dielectric layer including nano-particles and/or micro-particles therein, providing a third conductor on said second capacitive dielectric layer on said first conductor, forming a first thru-hole electrical connection between said second and third conductors, and forming a second thru-hole electrical connection between said first conductor and a fourth conductor, said first and second conductors and said first capacitive dielectric layer forming a first capacitor and said first and third conductors and said second capacitive dielectric layer forming a second capacitor when said capacitive substrate is operational; and
forming at least one dielectric layer and at least one conductive layer on opposite sides of said capacitive substrate to form a circuitized substrate having said capacitive substrate as an internal portion thereof.

19. A method of making an information handling system including a circuitized substrate having a capacitive substrate as part thereof, said method comprising:
forming a capacitive substrate including providing a first capacitive dielectric layer having first and second opposing sides, providing first and second conductors on said first and second opposing sides of said first capacitive dielectric layer, respectively, ink jet printing a second capacitive dielectric layer onto said first conductor on said first opposing side of said first capacitive dielectric layer, said second capacitive dielectric layer including nano-particles and/or micro-particles therein, providing a third conductor on said second capacitive dielectric layer on said first conductor, forming a first thru-hole electrical connection between said second and third conductors, and forming a second thru-hole electrical connection between said first conductor and a fourth conductor, said first and second conductors and said first capacitive dielectric layer forming a first capacitor and said first and third conductors and said second capacitive dielectric layer forming a second capacitor when said capacitive substrate is operational;
forming at least one dielectric layer and at least one conductive layer on opposite sides of said capacitive substrate to form a circuitized substrate having said capacitive substrate as an internal portion thereof;
providing a housing having electrical circuitry therein and positioning said circuitized substrate within said housing and electrically coupling said circuitized substrate to said electrical circuitry, said housing, electrical circuitry and circuitized substrate forming an information handling system.

* * * * *